United States Patent [19]

Tani et al.

[11] Patent Number: 5,389,491
[45] Date of Patent: Feb. 14, 1995

[54] NEGATIVE WORKING RESIST COMPOSITION

[75] Inventors: Yoshiyuki Tani; Masayuki Endo, both of Kadoma; Fumiyoshi Urano; Takanori Yasuda, both of Kawagoe, all of Japan

[73] Assignees: Matsushita Electric Industrial Co., Ltd., Kadoma; Wako Pure Chemical Industries, Ltd., Osaka, both of Japan

[21] Appl. No.: 82,399

[22] Filed: Jun. 28, 1993

[30] Foreign Application Priority Data

Jul. 15, 1992 [JP] Japan ................... 4-210961

[51] Int. Cl.6 ............... G03F 7/012; G03F 7/021; G03F 7/023
[52] U.S. Cl. ................... 430/170; 430/176; 430/177; 430/180; 430/181; 430/191; 430/196; 430/270
[58] Field of Search ............... 430/175, 176, 180, 177, 430/181, 191, 196, 170, 270

[56] References Cited

U.S. PATENT DOCUMENTS 4,343,885  8/1982  Reardon, Jr. ................... 430/281

FOREIGN PATENT DOCUMENTS

| 62-164045 | 7/1987 | Japan . |
| 1-293339 | 11/1989 | Japan . |
| 2-15270 | 1/1990 | Japan . |
| 2-120366 | 5/1990 | Japan . |
| 2120366 | 5/1990 | Japan . |
| 3-75652 | 3/1991 | Japan . |
| 375652 | 3/1991 | Japan . |
| 3-107162 | 5/1991 | Japan . |
| 4-70833 | 3/1992 | Japan . |
| 4-107560 | 4/1992 | Japan . |
| 4-123061 | 4/1992 | Japan . |
| 4-128760 | 4/1992 | Japan . |
| 4107560 | 4/1992 | Japan . |
| 4-143761 | 5/1992 | Japan . |
| 4-186248 | 7/1992 | Japan . |
| 4-215658 | 8/1992 | Japan . |
| 4-281455 | 10/1992 | Japan . |
| 4-291260 | 10/1992 | Japan . |
| 4-291261 | 10/1992 | Japan . |
| 4281455 | 10/1992 | Japan . |
| 4-314055 | 11/1992 | Japan . |

OTHER PUBLICATIONS

SPIE, vol. 1262, Advances in Resist Technology and Processing VII (1990) pp. 16–25, 49–59, 60–71.

Primary Examiner—Charles L. Bowers, Jr.
Assistant Examiner—Christopher G. Young

[57] ABSTRACT

A negative working resist composition comprising (a) an alkali-soluble resin, (b) an aromatic compound having at least two groups of the formula: $-OCH_2OR^1$ wherein $R^1$ is alkyl or aralkyl, (c) a photoacid generator, and (d) a solvent, can form fine patterns with high resolution when exposed to deep UV, KrF excimer laser light, etc. due to high light transmittance and high sensitivity.

8 Claims, 3 Drawing Sheets

FIG. IA
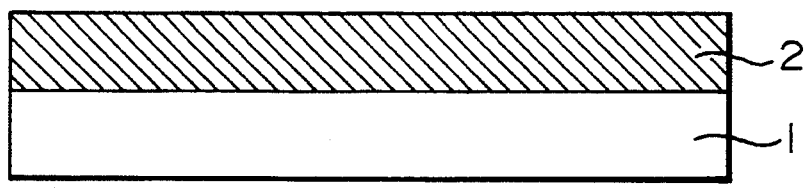
FIG. IB
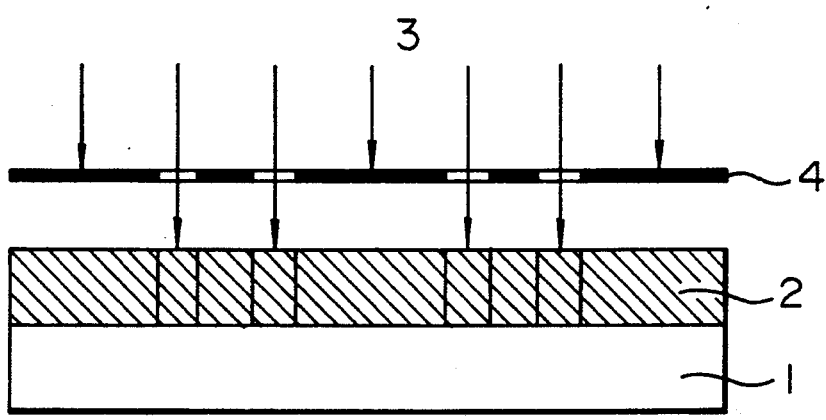
FIG. IC
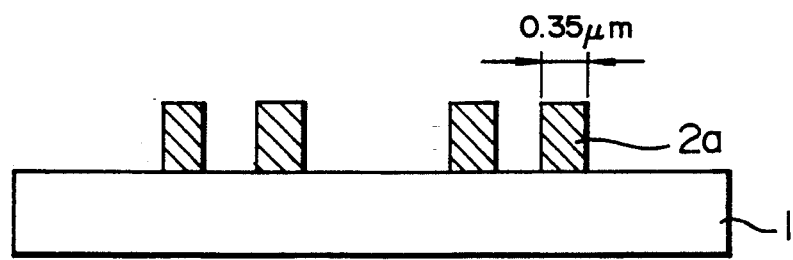

NEGATIVE WORKING RESIST COMPOSITION

BACKGROUND OF THE INVENTION

This invention relates to a negative working resist composition and lithography used for producing semiconductor elements and the like. More in detail, this invention relates to a resist material and a process for forming a pattern at the time of forming a negative working pattern using as an energy source for light exposure deep ultraviolet light of 300 nm or less, for example, KrF excimer laser light (248.4 nm), electron beams or X-rays.

With recent progress of semiconductor devices with higher density and increased packing density, light sources used for fine working, particularly those used in light exposure apparatuses for photolithography become shorter and shorter. Now, KrF excimer laser light (248.4 nm) is to be studied. But, negative working resist materials suitable for such a wavelength have not been found sufficiently.

For example, when a known resist material comprising an alkali-soluble resin and a bisazide compound is exposed to KrF excimer laser light or deep UV (ultraviolet light), the sensitivity is so low that it cannot be used for deep UV, KrF excimer laser light and electron beams wherein a highly sensitive resist material is required. Recently, after a proposal of a chemically-amplified resist material wherein an acid generated by exposure to light is used as a catalyst so as to reduce the exposure energy (i.e. to increase the sensitivity) [H. Ito, et al: Polym. Eng. Sci., vol. 23, p. 1012 (1983), etc.], various reports have been made. For example, there are proposed resist materials comprising a melamine derivative having a property of crosslinking with polyvinyl phenol in the presence of an acid and a photosensitive compound capable of generating an acid by exposure to light (a photoacid generator) (e.g. Japanese Patent Unexamined Publication Nos. H3-75652 (EP407086), H4-136858, H4-107560, H2-120366, etc.), a resist material comprising polyvinyl phenol and a photoacid generator having an azido group in the molecule (e.g. Japanese Patent Unexamined Publication No. H2-216153), resist materials comprising polyvinyl phenol having a methoxymethyl group or a methylol group in the molecule and a photoacid generator (e.g. Japanese Patent Unexamined Publication No. H2-170165, German Offenlegungsschrift 4025959, etc.). When these resist materials are used, there is obtained a pattern shape with adverse trapezoids as shown in FIG. 2C due to poor light transmittance of the resist materials, or a pattern shape with round surfaces as shown in FIG. 3C due to insufficient crosslinking reaction caused by deactivation of the acid generated by exposure to light on the surface areas. Sometimes, scum is produced on unexposed areas due to adhesion of fragments released from exposed areas depending on resist materials used. Further, there is another problem in that the pattern size remarkably changes with the lapse of time from the exposure to light to development. Thus, there are many problems to be overcome for practical use.

As mentioned above, although the negative working resist materials utilizing the chemical amplification action are more sensitive than known resist materials, they have many problems in that light transmittance at near 248.4 nm is insufficient, the acid generated by exposure to light is easily deactivated, the pattern size is easily changed with the lapse of time, etc., resulting in making these materials difficult for practical use. Therefore, highly sensitive resist materials overcoming these problems have been desired.

SUMMARY OF THE INVENTION

It is an object of the present invention to provide a negative working resist composition having high transmittance for deep UV, KrF excimer laser light, etc., and having high sensitivity to the light exposure to these light sources or irradiation with electron beams, X-rays, etc., overcoming the problems mentioned above.

It is another object of the present invention to provide a process for forming a pattern using such a resist composition to provide a pattern having high precision without changing a pattern size with the lapse of time.

The present invention provides a negative working resist composition comprising (a) an alkali-soluble resin, (b) a compound of the formula:

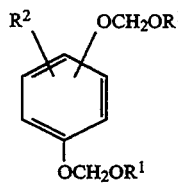

[I]

wherein $R^1$ is an alkyl group having 1 to 10 carbon atoms or an aralkyl group; and $R^2$ is a hydrogen atom, a hydroxyl group, an alkoxy group having 1 to 5 carbon atoms, an alkyl group having 1 to 10 carbon atoms or a group of the formula: $-OCH_2OR^1$, (c) a photosensitive compound capable of generating an acid upon exposure to light, and (d) a solvent capable of dissolving the components (a) to (c).

The present invention also provides a process for forming a negative working pattern which comprises the steps of:

(i) coating the above-mentioned negative working resist composition on a substrate and evaporating the solvent to form a film, (ii) exposing the film to light through a mask, (iii) subjecting the resulting film to heat treatment, and (iv) developing with an alkali aqueous solution.

BRIEF DESCRIPTION OF THE DRAWINGS

FIGS. 1A to 1C are cross-sectional views explaining the process for forming a negative working pattern of the present invention.

DESCRIPTION OF THE PREFERRED EMBODIMENTS

Figure 2A:
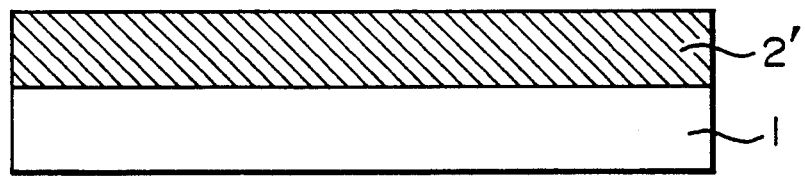
FIGS. 2A to 2C are cross-sectional views explaining a process of prior art wherein a pattern with adverse trapezoids is formed due to poor light transmittance.
Figure 2B:
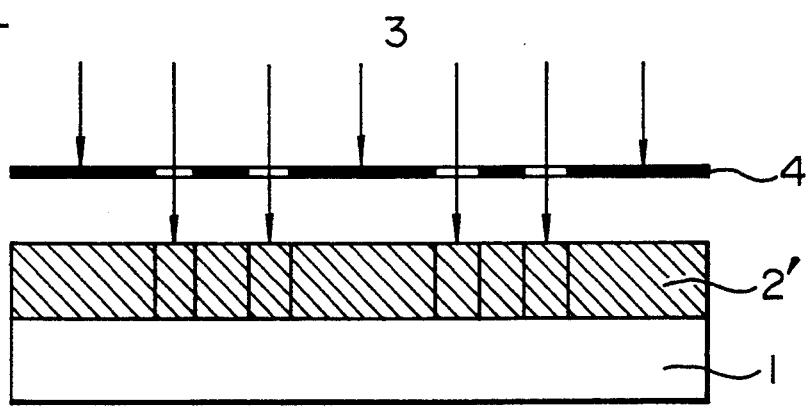
Figure 2C:
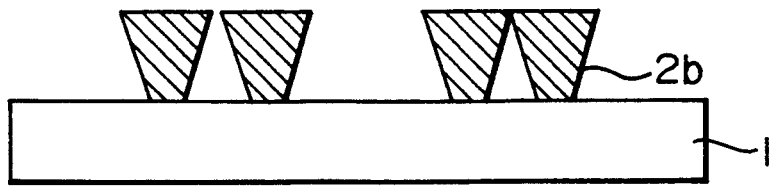
Figure 3A:
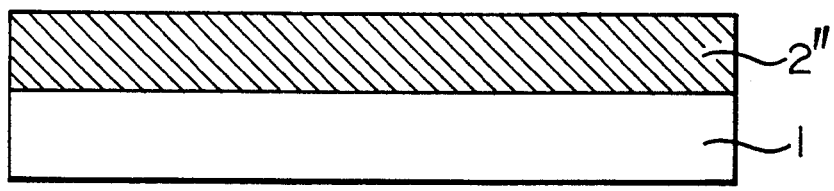
FIGS. 3A to 3C are cross-sectional views explaining another process of prior art wherein a pattern with round shapes is formed due to deactivation of the acid on the surface areas of resist film.
Figure 3B:
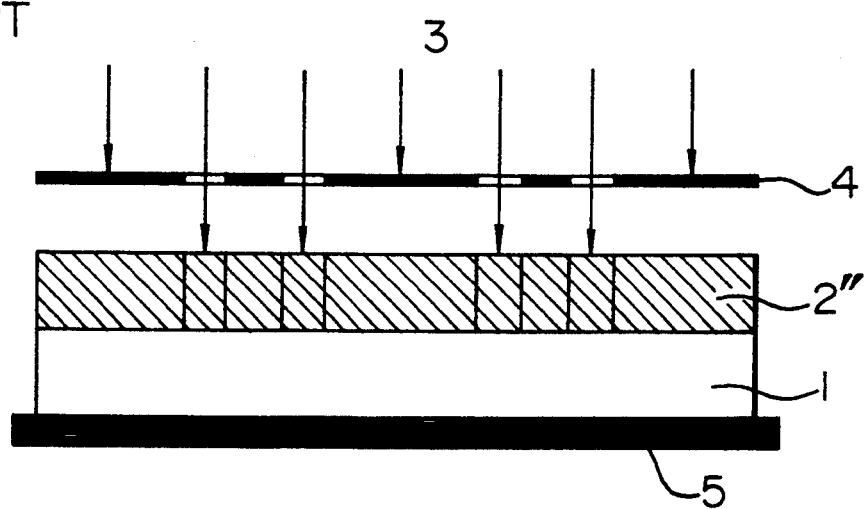
Figure 3C:
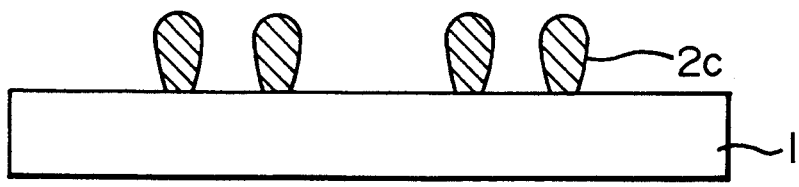

The negative working resist composition of the present invention comprises (a) an alkali-soluble resin, (b) a compound of the formula:

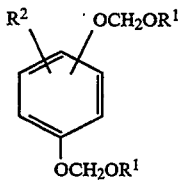

wherein $R^1$ is an alkyl group having 1 to 10 carbon atoms or an aralkyl group; and $R^2$ is a hydrogen atom, a hydroxyl group, an alkoxy group having 1 to 5 carbon atoms, an alkyl group having 1 to 10 carbon atoms or a group of the formula: —$OCH_2OR^1$, (c) a photosensitive compound capable of generating an acid upon exposure to light (photoacid generator), and (d) a solvent capable of dissolving the components (a) to (c), and is effective in chemical amplification action.

In the formula [I], the alkyl group having 1 to 10 carbon atoms in the definition of $R^1$ and $R^2$ includes methyl, ethyl, propyl, butyl, pentyl, hexyl, heptyl, octyl, nonyl, decyl, etc., which can be straight-chain, branched or cyclic, and 1-methylcyclohexyl, etc. The aralkyl group in the definition of $R^1$ includes benzyl, phenethyl, phenylpropyl, methylbenzyl, methylphenethyl, ethylbenzyl, etc. The alkoxy group having 1 to 5 carbon atoms in the definition of $R^2$ includes methoxy, ethoxy, propoxy, butoxy, pentyloxy, etc., which can be either straight-chain or branched.

The compound of the formula [I] is characterized by having two or more functional groups of the formula:

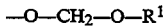

wherein $R^1$ is as defined above, which easily brings about a condensation reaction with a phenolic resin with heating in the presence of an acid, in order to carry out crosslinking between phenolic resin molecules with the alkoxymethoxy group or the aralkyloxymethoxy group.

Examples of the compound of the formula [I] are as follows:

1,2-bis(methoxymethoxy)benzene,
1,2-bis(ethoxymethoxy)benzene,
1,2-bis(isopropoxymethoxy)benzene,
1,2-bis(tert-butoxymethoxy)benzene,
1,3-bis(methoxymethoxy)benzene,
1,3-bis(isopropoxymethoxy)benzene,
1,3-bis(isobutoxymethoxy)benzene,
1,3-bis(tert-butoxymethoxy)benzene,
1,3-bis(sec-butoxymethoxy)benzene,
1,3-bis(cyclohexyloxymethoxy)benzene,
1,4-bis(methoxymethoxy)benzene,
1,4-bis(ethoxymethoxy)benzene,
1,4-bis(isopropoxymethoxy)benzene,
1,4-bis(sec-butoxymethoxy)benzene,
1,4-bis(cyclohexyloxymethoxy)benzene,
1,4-bis(benzyloxymethoxy)benzene,
3,5-bis(methoxymethoxy)toluene,
3,5-bis(isopropoxymethoxy)toluene,
3,5-bis(tert-butoxymethoxy)toluene,
2,4-bis(methoxymethoxy)-1-hexylbenzene,
2,4-bis(ethoxymethoxy)-1-hexylbenzene,
2,4-bis(2-phenethyloxymethoxy)-1-hexylbenzene,
1,2,3-tris(methoxymethoxy)benzene,
1,2,3-tris(isopropoxymethoxy)benzene,
1,2,3-tris(isobutoxymethoxy)benzene,
1,2,3-tris(sec-butoxymethoxy)benzene,
1,2,3-tris(tert-butoxymethoxy)benzene,
1,2,3-tris(cyclohexyloxymethoxy)benzene,
1,2-bis(methoxymethoxy)-3-hydroxybenzene,
1,2,4-tris(methoxymethoxy)benzene,
1,2,4-tris(isopropoxymethoxy)benzene,
1,2,4-tris(isobutoxymethoxy)benzene,
1,2,4-tris(sec-butoxymethoxy)benzene,
1,2,4-tris(tert-butoxymethoxy)benzene,
1,2,4-tris(cyclohexyloxymethoxy)benzene,
1,3,5-tris(methoxymethoxy)benzene,
1,3,5-tris(ethoxymethoxy)benzene,
1,3,5-tris(isopropoxymethoxy)benzene,
1,3,5-tris(isobutoxymethoxy)benzene,
1,3,5-tris(sec-butoxymethoxy)benzene,
1,3,5-tris(tert-butoxymethoxy)benzene,
1,3,5-tris(cyclohexyloxymethoxy)benzene,
1,3-bis(isobutoxymethoxy)-5-hydroxybenzene, etc.

These compounds can be used singly or as a mixture thereof.

The compound of the formula [I] can easily be produced by the following process (a), (b) or (c).

Process (a)

A phenolic compound of the formula:

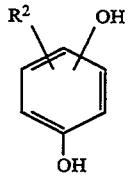

wherein $R^2$ is as defined above, in an amount of 1 mole is reacted with 2 to 20 moles of a halogen compound of the formula:

wherein X is Cl, Br or I; and $R^1$ is as defined above, in the presence of a base in an organic solvent at 0° to 100° C. for 1 to 24 hours with stirring, followed by a conventional after-treatment. As the base, there can be used $CH_3ONa$, $C_2H_5ONa$, NaH, NaOH, KOH, triethylamine, pyridine, piperidine, etc. As the solvent, there can be used methylene chloride, toluene, N,N-dimethylformamide, N,N-dimethylacetamide, ethyl ether, 1,4-dioxane, tetrahydrofuran, etc.

Process (b)

A phenolic compound of the formula [VIII] in an amount of 1 mole is reacted with 2 to 20 moles of an acetal compound of the formula:

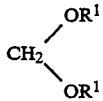

wherein $R^1$ is as defined above, in the presence of a catalytic amount of an acid catalyst in an organic solvent at 0° to 100° C. for 1 to 24 hours with stirring, followed by a conventional after-treatment. As the acid catalyst, there can be used p-toluenesulfonic acid, benzenesulfonic acid, sulfuric acid, phosphoric acid, hydrochloric acid, hydrobromic acid, boron trifluoride.etherate, etc. As the solvent, there can be used methylene chloride, ethyl ether, acetone, 1,4-dioxane, tetrahydrofuran, etc.

Process (c)

A phenolic compound of the formula [VIII] in an amount of 1 mole is reacted with 2 to 10 moles of acetyl chloride, acetic anhydride or p-toluenesulfonyl chloride in the presence or absence of a base in an organic solvent or without using a solvent at 0° to 100° C. for 1 to 24 hours with stirring, followed by a conventional aftertreatment to produce a compound of the formula:

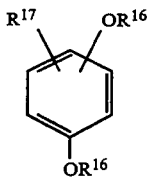     [XI]

wherein $R^{16}$ is an acetyl group or a p-toluenesulfonyl group; $R^{17}$ is a hydrogen atom, an alkoxy group having 1 to 5 carbon atoms, an alkyl group having 1 to 10 carbon atoms or a group of the formula: $R^{16}O$—($R^{16}$ is an acetyl group or a p-toluenesulfonyl group), or a compound of the formula:

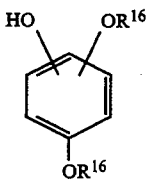     [XII]

wherein $R^{16}$ is as defined above, or a compound of the formula:

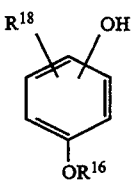     [XIII]

wherein $R^{16}$ is as defined above; and $R^{18}$ is a hydrogen atom, a hydroxyl group, an alkoxy group having 1 to 5 carbon atoms or an alkyl group having 1 to 10 carbon atoms, or a mixture thereof. As the base, there can be used triethylamine, pyridine, piperidine, $CH_3ONa$, NaH, NaOH, KOH, etc. As the solvent, there can be used methylene chloride, benzene, toluene, ethyl ether, tetrahydrofuran, etc.

Then, the compound of the formula [XI], [XII] or [XIII] or a mixture thereof in an amount of 1 mole is reacted with 1 to 20 moles of a halogen compound of the formula:

 $R^1OCH_2X$     [IX]

wherein X is Cl, Br or I; and $R^1$ is as defined above, in the presence of a base in an organic solvent at 0° to 100° C. for 1 to 24 hours with stirring, followed by a conventional after-treatment to produce the compound of the formula [I]. As the base, there can be used $CH_3ONa$, NaH, NaOH, KOH, triethylamine, pyridine, piperidine, etc. As the solvent, there can be used methylene chloride, toluene, N,N-dimethylformamide, N,N-dimethylacetamide, ethyl ether, 1,4-dioxane, tetrahydrofuran, etc.

As the alkali-soluble resin, there can be used resins having a phenolic hydroxyl group and soluble in an alkali aqueous solution. Examples of the alkali-soluble resin are novolak resins, polyvinyl phenol, polyisopropenyl phenol, poly(tert-butoxycarbonyloxystyrene/p-hydroxystyrene), poly(p-tert-butoxystyrene/p-hydroxystyrene), poly(p-tetrahydropyranyloxystyrene/p-hydroxystyrene), poly(tert-butyl p-vinylphenoxyacetate/p-hydroxystyrene), poly(p-vinylphenoxyacetate/p-hydroxystyrene), poly(p-1-ethoxyethoxystyrene/p-hydroxystyrene), poly(p-trimethylsilyloxystyrene/p-hydroxystyrene), poly(p-1-methoxy-1-methylethoxystyrene/p-hydroxystyrene), etc.

The ratio of the component (b) to the component (a), i.e. the compound of the formula [I] to the alkali-soluble resin, can be in any range so long as the mixture can easily be soluble in an alkali aqueous solution and becomes difficultly soluble in an alkali aqueous solution with heating in the presence of an acid. Preferable amount of the component (a) is about 1 to 50% by weight, more preferably about 5 to 30% by weight based on the weight of the alkali-soluble resin (a).

As the component (c), i.e. the photoacid generator, there can be used any photosensitive compounds which generate an acid upon exposure to light and do not give bad influences on pattern shapes. Particularly preferable examples of the photoacid generators are a compound of the formula:

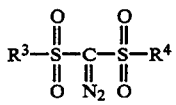     [II]

wherein $R^3$ and $R^4$ are independently a straight-chain, branched or cyclic alkyl group having 1 to 10 carbon atoms, a haloalkyl group having 1 to 10 carbon atoms, or a group of the formula:

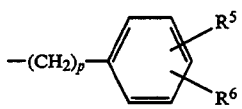     [III]

wherein $R^5$ and $R^6$ are independently a hydrogen atom, a lower alkyl group having 1 to 5 carbon atoms (either straight-chain or branched), or a haloalkyl group having 1 to 5 carbon atoms (either straight-chain or branched); and p is zero or an integer of 1 or more, preferably 3 or less, a compound of the formula:

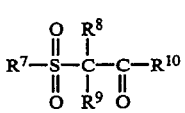     [IV]

wherein $R^7$ is a straight-chain, branched or cyclic alkyl group having 1 to 10 carbon atoms, a trifluoromethyl group, a phenyl group or a tolyl group; $R^8$ and $R^9$ are independently a hydrogen atom, or a lower alkyl group having 1 to 5 carbon atoms (either straight-chain or branched); and $R^{10}$ is a straight-chain, branched or cyclic alkyl group, a phenyl group, a halogen-substituted phenyl group, an alkyl-substituted phenyl group, an alkoxy-substituted phenyl group or an alkylthio-substituted phenyl group, a compound of the formula:

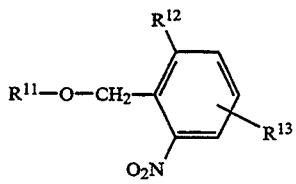

[V]

wherein $R^{11}$ is a trichloroacetyl group, a p-toluenesulfonyl group, a p-trifluoromethylbenzenesulfonyl group, a methanesulfonyl group or a trifluoromethanesulfonyl group; and $R^{12}$ and $R^{13}$ are independently a hydrogen atom, a halogen atom or a nitro group, a compound of the formula:

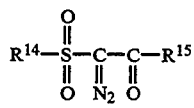

[VI]

wherein $R^{14}$ is a straight-chain, branched or cyclic alkyl group having 1 to 10 carbon atoms, an aralkyl group or an aryl group; and $R^{15}$ is a straight-chain, branched or cyclic alkyl group having 1 to 10 carbon atoms or an aralkyl group.

In the formula [VI], the aralkyl group includes a benzyl group, a phenethyl group, a phenylpropyl group, a methylbenzyl group, a methylphenethyl group, an ethylbenzyl group, etc. and the aryl group includes a phenyl group, a naphthyl group, etc.

Preferable examples of the photoacid generator are as follows: bis(p-toluenesulfonyl)diazomethane, 1-p-toluenesulfonyl-1-methanesulfonyldiazomethane, bis(isopropylsulfonyl)diazomethane, bis(cyclohexylsulfonyl)diazomethane, bis(tert-butylsulfonyl)diazomethane, 1-cyclohexylsulfonyl-1-tert-butylsulfonyldiazomethane, 1-p-toluenesulfonyl-1-cyclohexylcarbonyldiazomethane, 2-methyl-2-p-toluenesulfonylpropiophenone, 2-methanesulfonyl-2-methyl-(4-methylthio)propiophenone, 2,4-dimethyl-2-(p-toluenesulfonyl)pentan-3-one, 2-(cyclohexylcarbonyl)-2-(p-toluenesulfonyl)propane, 2-nitrobenzyl p-toluenesulfonate, 2,6-dinitrobenzyl trichloroacetate, 2,4-dinitrobenzyl p-trifluoromethylbenzenesulfonate, 1-tert-butylsulfonyl-1-acetyldiazomethane, 1-tert-butylsulfonyl-1-propanoyldiazomethane, 1-tert-butylsulfonyl-1-(2-methyl)propanoyldiazomethane, 1-tert-butylsulfonyl-1-(2,2-dimethyl)propanoyldiazomethane, 1-tert-butylsulfonyl-1-cyclohexylcarbonyldiazomethane, 1-ethylsulfonyl-1-cyclohexylcarbonyldiazomethane, 1-ethylsulfonyl-1-(3-phenyl)propanoyldiazomethane, 1-cyclohexylsulfonyl-1-(2,2-dimethyl)propanoyldiazomethane, 1-cyclohexylsulfonyl-1-(2-methyl)propanoyldiazomethane, 1-cyclohexylsulfonyl-1-cyclohexylcarbonyldiazomethane, 1-benzylsulfonyl-1-(2-methyl)propanoyldiazomethane, 1-benzylsulfonyl-1-cyclohexylcarbonyldiazomethane, 1-phenylsulfonyl-1-(2-methyl)propanoyldiazomethane, 1-(p-toluenesulfonyl)-1-(2,2-dimethyl)propanoyldiazomethane, 1-(4-tert-butyl)phenylsulfonyl-1-cyclohexylcarbonyldiazomethane, etc.

As the solvent, the component (d), there can be used those capable of dissolving the components (a), (b) and (c) and preferably having no absorption near 230 to 300 nm. Examples of the solvent are methyl Cellosolve acetate, ethyl Cellosolve acetate, propylene glycol monomethyl ether acetate, propylene glycol monoethyl ether acetate, methyl lactate, ethyl lactate, 2-ethoxyethyl acetate, methyl pyruvate, ethyl pyruvate, methyl 3-methoxypropionate, ethyl 3-methoxypropionate, N-methyl-2-pyrrolidone, cyclohexanone, 3-methylmethoxybutanol, 3-methyl-3-methoxybutyl acetate, methoxybutanol, methoxybutyl acetate, methyl ethyl ketone, 1,4-dioxane, ethylene glycol monoisopropyl ether, diethylene glycol monomethyl ether, diethylene glycol dimethyl ether, etc. These solvents can be used singly or as a mixture thereof.

The resist composition may further contain one or more dyes, nonionic surfactants, fluorine series surfactants, bleaching agents, etc., if necessary.

The pattern formation using such a resist composition can be carried out as follows.

That is, the process for forming a negative working pattern comprises the steps of:

(i) coating the above-mentioned negative working resist composition on a substrate and evaporating the solvent to form a film, (ii) exposing the film to light through a mask, (iii) subjecting the resulting film to heat treatment, and (iv) developing with an alkali aqueous solution.

More concretely, the resist composition is coated on a substrate such as a silicon wafer so as to make the thickness of the resulting film about 0.5 to 2 μm and baked in an oven preferably at a temperature of 70° to 130° C. for 10 to 30 minutes, or on a hot plate preferably at a temperature of 70° to 130° C. for 1 to 2 minutes. Then, a mask is placed on the resulting resist film so as to form the desired pattern, followed by exposure to deep UV having a wavelength of 300 nm or less with an exposure dose of about 1 to 100 mJ/cm². After further baking at 70° to 150° C. for 1 to 2 minutes on a hot plate, the development is carried out using a developer (an aqueous alkali solution) such as an aqueous solution of 1 to 5% tetramethylammonium hydroxide (TMAH) for 0.5 to 3 minutes by a conventional method such as a dip method, a puddle method, a spray method, etc. As a result, the desired negative working pattern as shown in FIG. 1C is formed on the substrate.

The negative working resist composition comprises preferably 0..01 to 0.5 part by weight, more preferably 0.05 to 0.3 part by weight of the compound of the formula [I] (the component (b)), preferably 0.01 to 0.3 part by weight, more preferably 0.01 to 0.1 part by weight of the photoacid generator (the component (c)), and preferably 1 to 20 parts by weight, more preferably 1.5 to 6 parts by weight of the solvent (the component (d)) per part by weight of the resin (the component (a)).

As the developer used in the pattern forming process, there can be used any aqueous alkali solutions which hardly dissolve the exposed areas and dissolve the non-exposed areas depending on the solubility of resin component in the resist composition for the alkali solutions. Usually the concentration of the aqueous alkali solution is 0.01 to 20% by weight. Examples of the alkali solution are aqueous solutions of organic amines such as TMAH, choline, triethanolamine, etc., and inorganic alkalis such as NaOH, KOH, etc. The developer can contain various surfactants, alcohols, etc. so as to improve surface wetting properties.

The alkali-soluble resin (a) and the compound (b) of the formula [I] are in common high in light transmittance at near 248.4 nm. The compound of the formula [I] has a property of carrying out crosslinking reaction with the phenolic resin (the component (a)) with ease in the presence of an acid with heating due to having two or more functional groups represented by the formula [VII]. Further, when the compound of the formulae [II], [IV], [V] or [VI] is used as the photoacid generator, the acid generated by exposure to light has smaller acid strength and mobility compared with the acid used in prior art resist materials. Thus, when a pattern is formed by using the resist composition of the present invention, the shape of the resulting pattern is fine and good as shown in FIG. 1C as mentioned above. Further, according to the present invention, the obtained pattern size is stable and can be maintained for a long period of time after exposure to light. In addition, in the present invention, since the phenolic hydroxyl group is contained in the alkali-soluble resin, the resistance to dry etching is good, and the adhesiveness to the substrate is excellent. Further, the resin molecules in the resist composition crosslink each other, so that the heat resistance is remarkably excellent.

The resist composition of the present invention containing the photoacid generators of the formulae [II], [IV], [V] and [VI] can generate an acid when exposed to not only KrF excimer laser light, but also electron beams and X-rays, so that good chemical amplification action can be obtained. Therefore, patterns can be formed by using the resist composition of the present invention with a low exposure amount of deep UV, KrF excimer laser light (248.4 nm), electron beams or X-rays by applying chemical amplification method.

The mechanism of formation of pattern can be explained as follows. The areas exposed to KrF excimer laser light, deep UV, etc. generate an acid by photo reactions (1), (2), (3) and (4) mentioned below:

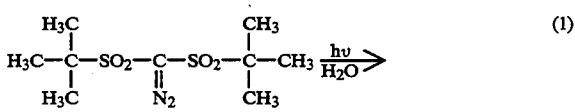
(1)

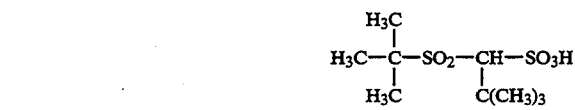
(2)

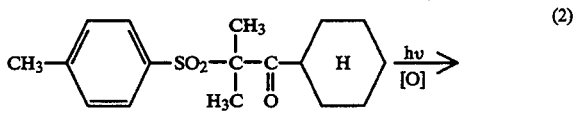
(3)

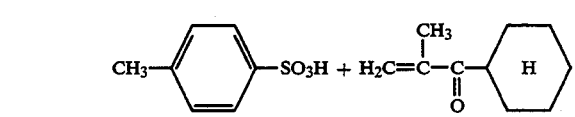

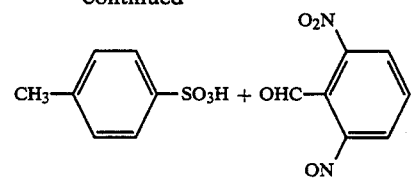
(4)

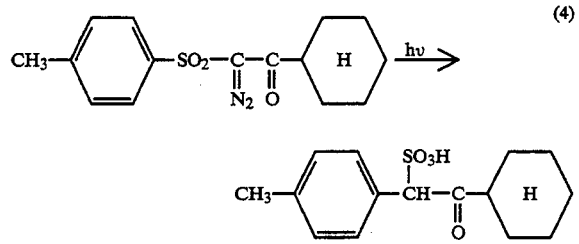

When subjected to heat treatment subsequent to the light exposure step, the special functional group of the formula [VII] brings about crosslinking reaction with neighboring phenolic resins by the action of acid to form resins with higher molecular weights, resulting in making hardly soluble in an alkali developer. Thus, the resulting resin hardly dissolves in the developer at the time of development. Particular when $R^1$ in the special functional group in the formula [VII] is a branched or cyclic alkyl, the crosslinking reaction with the phenolic resin becomes remarkably easy and gives preferable results.

On the other hand, since non-exposed areas do not generate an acid, no chemical reaction takes place even if subjected to heat treatment. Thus, the property of strong alkali solubility can be maintained.

As mentioned above, when the patterns are formed by using the resist composition of the present invention, a great difference in dissolution rate for the alkali developer takes place between the exposed areas and non-exposed areas. Further, since the light transmittance of the resist composition at near 248.4 nm is good, the chemical amplification action proceeds smoothly into under portions of the resist film. As a result, there are formed negative working patterns with good contrast.

The present invention is illustrated by way of the following Examples, in which all percents are by weight unless otherwise specified.

Synthesis Example 1

Synthesis of sec-butoxymethylchloride

A current of dry hydrogen chloride was passed into a mixture of 75% paraformaldehyde (95.1 g, 2.38 mole) and 2-butanol (185.3 g, 2.50 mole) until saturated. After stirring for 1 hour at room temperature, the reaction mixture was separated. The oily layer obtained was dried over anhydrous $CaCl_2$ and drying agent was filtered off. The filtrate was distilled under reduced pressure to give 200.4 g of sec-butoxymethylchloride as a colorless oil having a boiling point of 62°–67° C./120 mmHg.

$^1$HNMR δppm ($CDCl_3$): 0.89–0.95(3H,t, $CH_3$ $CH_2$), 1.18–1.21(3H,d, $CH_3$ CH), 1.50–1.60(2H,m, $CH_3$ $CH_2$), 3.70–3.90(1H,m, $CH_3$ $CHCH_2$ $CH_3$), 5.55(2H,s, $OCH_2$ Cl).

Synthesis Example 2

Synthesis of isopropoxymethylchloride

Using isopropanol (150.2 g, 2.50 mole) in place of 2-butanol used in Synthesis Example 1, the reaction and treatment were carried out in the same manner as described in Synthesis Example 1. The resultant oil was distilled under reduced pressure to give 190 g of isopropoxymethylchloride as a colorless oil having a boiling point of 36–39° C./80 mmHg.

$^1$HNMR δppm (CDCl$_3$): 1.16–1.24(6H,d, CH$_3$×2), 4.01–4.10(1H,m, CH), 5.55(2H,s,CH$_2$).

Synthesis Example 3

Synthesis of cyclohexyloxymethylchloride

Using cyclohexanol (250.4 g, 2.50 mole) in place of 2-butanol used in Synthesis Example 1, the reaction and treatment were carried out in the same manner as described in Synthesis Example 1. The resultant oil was distilled under reduced pressure to give 241.5 g of cyclohexyloxymethylchloride as a colorless oil having a boiling point of 78°–81° C./16 mmHg.

Synthesis Example 4

Synthesis of 1,3,5-tris(methoxymethoxy)benzene

To a suspension of sodium hydride (60% in oil, 21.2 g, 0.53 mole) in N,N-dimethylformamide[DMF] (130 ml), a solution of phloroglucinol (25.3 g, 0.16 mole) in DMF (150 ml) was added dropwise under nitrogen stream at 25° C. or lower, and stirred at room temperature for 2 hours. Then chloromethylmethylether (51.7 g, 0.51 mole) was added dropwise to the mixture at 25° C. or lower, and reacted with stirring at room temperature for 3 hours. After standing at room temperature overnight, the reaction mixture was poured into H$_2$O (750 ml), and extracted with ethyl acetate (200 ml ×4). The organic layer was washed with 5% sodium hydroxide aqueous solution (250 ml×4) and H$_2$O (250 ml×4), and dried over anhydrous MgSO$_4$. The drying agent was filtered off. The filtrate was concentrated under reduced pressure. The residual yellow oil (19 g) was chromatographed on silica gel [Wakogel C-200; mfd. by Wako Pure Chemical Industries, Ltd.] with n-hexane/ethyl acetate [10/1→5/1→3/1 (v/v)] as eluent to afford 11.5 g of 1,3,5-tris(methoxymethoxy)benzene as a colorless oil.

$^1$HNMR δppm (CDCl$_3$) : 3.46(9H,s,CH$_3$×3), 5.12(6H,s,CH$_2$ ×3), 6.42(3H,s,ArH).

IR(Neat) ν cm$^{-1}$: 2960, 2905, 2845, 1605.

UV (MeOH)λmax: 268 nm(ε539), 248 nm(ε182).

Synthesis Example 5

Synthesis of 1,3-bis(methoxymethoxy)benzene

To a suspension of sodium hydride (60% in oil, 8.8 g, 0.22 mole) in DMF (60 ml), a solution of resorcinol (11.0 g, 0.10 mole) in DMF (95 ml) was added dropwise under nitrogen stream at 25° C. or lower, and stirred at room temperature for 1.5 hours. Then, chloromethylmethylether (17.1 g, 0.21 mole) was added dropwise to the mixture at 25° C. or lower, and reacted with stirring at room temperature for 4.5 hours. After standing at room temperature overnight, the reaction mixture was carried out in the same manner as described in Synthesis Example 4. Then, the residual crude oil (12.4 g) was distilled under reduced pressure to give 8.0 g of 1,3-bis(methoxymethoxy)benzene as a pale yellow oil having a boiling point of 112°–116° C./5 mmHg.

$^1$HNMR δppm (CDCl$_3$): 3.52(6H,s,CH$_3$×2), 5.21(4H,s,CH$_2$ ×2), 6.76–7.20(4H,m,ArH)

Synthesis Example 6–8

Synthesis of 1,3-bis(alkoxymethoxy)benzene

Using each of alkoxymethylchloride, obtained in above Synthesis Examples 1–3, the reaction and treatment were carried out in the same manner as described in Synthesis Example 5 to give the corresponding 1,3-bis(alkoxymethoxy)benzene. The results were shown in Table 1.

TABLE 1

| Syn. Ex. No. | Alkoxy group | Appearance | $^1$HNMR δ ppm (CDCl$_3$) |
|---|---|---|---|
| 6 | Isopropoxy | Yellow oil | 1.19–1.21(12H, d, CH$_3$×4), 3.98–4.03(2H, m, CH×2), 5.23(4H, s, CH$_2$×2), 6.67–7.20(4H, m, ArH) |
| 7 | sec-Butoxy | Yellow oil | 0.83–0.91(6H, t, CH$_3$ CH$_2$×2), 1.13–1.17(6H, d, CH$_3$ CH×2), 1.43–1.59(4H, m, CH$_3$ CH$_2$×2), 3.72–3.79(2H, m, CH×2), 5.23(4H, s, CH$_2$×2), 6.65–7.18(4H, m, ArH) |
| 8 | Cyclohexyloxy | Yellow oil | 1.17–1.91(20H, m, cyclohexylic-CH$_2$×10), 3.63–3.71(2H, m, cyclohexylic-CH×2), 5.25(4H, s, CH$_2$×2), 6.67–7.19(4H, m, ArH) |

Synthesis Example 9

Synthesis of 1,4-bis(methoxymethoxy)benzene

Using hydroquinone (8.0 g, 73 mmole) in place of resorcinol used in Synthesis Example 5, the reaction and treatment were carried out in the same manner as described in Synthesis Example 5. The resultant oil (14 g) was chromatographed on silica gel [Wakogel C-200; mfd. by Wako Pure Chemical Industries, Ltd.] with n-hexane/ methylene chloride [3/1(v/v)] as eluent to afford 11.5 g of 1,4-bis(methoxymethoxy)benzene as a pale yellow oil.

$^1$HNMR δppm (CDCl$_3$) : 3.45(6H,s,CH$_3$×2), 5.10(4H,s,CH$_2$×2), 6.96(4H,s,ArH).

Synthesis Examples 10–12

Synthesis of 1,4-bis(alkoxymethoxy)benzene

Using each of alkoxymethylchlorides obtained in above Synthesis Examples 1–3, the reaction and treatment were carried out in the same manner as described in Synthesis Example 9 to give the corresponding 1,4-bis(alkoxymethoxy)benzene. The results were shown in Table 2.

| Syn. Ex. No. | Alkoxy group | Appearance | $^1$HNMR δ ppm (CDCl$_3$) |
|---|---|---|---|
| 10 | Isopropoxy | Yellow oil | 1.10–1.25(12H, d, CH$_3$×4), 4.40–4.45(2H, m, CH×2), 5.20(4H, s, CH$_2$×2), 6.96(4H, s, ArH) |
| 11 | sec-Butoxy | Yellow oil | 0.80–0.86(6H, t, CH$_3$ CH$_2$×2), 1.13–1.16(6H, d, CH$_3$ CH×2), 1.35–1.60(4H, m, CH$_3$ CH$_2$×2), 3.60–3.80(2H, m, CH×2), 5.18(4H, s, CH$_2$×2), 6.94(4H, s, ArH) |
| 12 | Cyclohexyloxy | White crystals mp. 42.5–43.5° C. | 1.24–1.87(20H, m, cyclohexylic-CH$_2$×10), 3.66(2H, m, cyclohexylic-CH×2), 5.20(4H, s, CH$_2$×2), |

| Syn. Ex. No. | Alkoxy group | Appearance | $^1$HNMR δ ppm (CDCl$_3$) |
|---|---|---|---|
| | | | 6.94(4H, s, ArH) |

Synthesis Example 13

Synthesis of 1,3,5-tris(isopropoxymethoxy)benzene (1) To a solution of phloroglucinol (16.7 g, 103.2 mmole) in pyridine (16.3 g, 206.4 mmole), acetic anhydride (21.1 g, 206.4 mmole) was added dropwise at 20°–30° C., and reacted with stirring for 5 hours at room temperature. After standing at room temperature overnight, the reaction mixture was poured into H$_2$O (400 ml) and extracted with ethyl acetate (100 ml×3), the organic layer was washed with H$_2$O (100 ml×5) and dried over anhydrous MgSO$_4$. The drying agent was filtered off. The filtrate was evaporated in vacuo to give 10.6 g of yellow oil as a residue. The residual yellow oil was found to have a mixture comprising monoacetyl compound and diacetyl compound, based on $^1$HNMR.

(2) A solution of the mixed acetyl compounds (10.6 g) obtained in above (1) in DMF (25 ml) was added dropwise to a suspension of sodium hydride (60% in oil, 5.65 g, 0.14 mole) in toluene (55 ml) at 35° C. or lower under nitrogen stream, and stirred for 2 hours at room temperature. Then isopropoxymethylchloride (15.0 g, 0.14 mole) obtained in Synthesis Example 2 was added dropwise to a reaction mixture at 25° C. or lower, and stirred for 3 hours at room temperature. After standing at room temperature overnight, the reaction mixture was poured into ice-cold H$_2$O (200 ml) and extracted with methylene dichloride (250 ml×3). The organic layer was washed H$_2$O (200 ml×2) and dried over anhydrous MgSO$_4$. The drying agent was filtered off. The filtrate was evaporated in vacuo to give 10.1 g of brown oil as a residue. The residual oil was found to have a mixture comprising 1-propoxymethoxy-3,5-diacetylbenzene and 1-acetyl-3,5-diisopropoxymethoxybenzene, based on $^1$HNMR.

(3) A suspension of the mixed ether compounds (10.1 g) obtained in above (2) and anhydrous potassium carbonate (30 g) in methanol (120 ml) was reacted with stirring for 7 hours at room temperature. After standing overnight, the reaction mixture was poured into H$_2$O (100 ml), and extracted with ethyl acetate (100 ml×3). The organic layer was washed with H$_2$O (100 ml×2) and dried over anhydrous MgSO$_4$. The drying agent was filtered off. The filtrate was evaporated in vacuo, and the resultant oil (10.2 g) was purified by column chromatography on silica gel [Wakogel C-200; mfd. by Wako Pure Chemical Industries, Ltd.] with n-hexane/ethyl acetate [1/1(v/v)] to afford 4.5 g of 1.3-bis-(isopropoxymethoxy)phenol as a pale yellow oil.

(4) Using 1,3-bis(isopropoxymethoxy)phenol (1.20 g, 4.4 mmole) obtained in above (3) and isopropoxymethylchloride (3.6 g, 33 mmole) obtained in Synthesis Example 2, the reaction and treatment were carried out in the same manner as described in Synthesis Example 4 to afford 1.16 g of 1,3,5-tris(isopropoxymethoxy)benzene as a pale yellow oil.

$^1$HNMR δppm (CDCl$_3$): 1.15–1.20(18H,d,CH$_3$×6), 3.94–4.03(3H,m, CH×3), 5.28(6H,s,CH$_2$×3), 6.41(3H,s,ArH).

Synthesis Examples 14–15

Synthesis of 1,3,5-tris(alkoxymethoxy)benzene

Using each of alkoxymethylchlorides obtained in Synthesis Examples 1–3, the reaction and treatment were carried out in the same manner as described in Synthesis Example 13 to give the corresponding 1,3,5-tris(alkoxymethoxy)benzene. The results were shown in Table 3.

TABLE 3

| Syn. Ex. No. | Alkoxy group | Appearance | $^1$HNMR δ ppm (CDCl$_3$) |
|---|---|---|---|
| 14 | sec-Butoxy | Yellow oil | 0.83–0.88(9H, t, CH$_3$ CH$_2$×3), 1.15–1.17(9H, d, CH$_3$×3), 1.43–1.56(6H, m, CH$_2$×3), 3.70–3.77(3H, m, CH×3), 5.20(6H, s, CH$_2$×3), 6.40(3H, s, ArH) |
| 15 | Cyclohexyloxy | Yellow oil | 1.17–1.90(30H, m, cyclohexylic-CH$_2$×15), 3.63–3.69(3H, m, cyclohexylic-CH×3), 5.22(6H, s, CH$_2$×3), 6.40(3H, s, ArH) |

Synthesis Examples 16–17

Synthesis of 1,2,4-tris(alkoxymethoxy)benzene

Using 1,2,4-trihydroxybenzene in place of phloroglucinol used in Synthesis Example 13, and chloromethylmethylether or isopropoxymethylchloride obtained in Synthesis Example 2, the reaction and treatment were carried out in the same manner as described in Synthesis Example 13 to give the corresponding 1,2,4-tris(alkoxymethoxy)benzene. The results were shown in Table 4.

TABLE 4

| Syn. Ex. No. | Alkoxy group | Appearance | $^1$HNMR δ ppm (CDCl$_3$) |
|---|---|---|---|
| 16 | Methoxy | Yellow oil | 3.48(3H, s, OCH$_3$), 3.51(6H, s, OCH$_3$×2), 5.10(2H, s, CH$_2$), 5.15(2H, s, CH$_2$), 5.21(2H, s, CH$_2$), 6.63–7.07(3H, m, ArH) |
| 17 | Isopropoxy | Yellow oil | 1.18–1.21(18H, d, CH$_3$×6), 3.98–4.09(3H, m, CH×3), 5.18(2H, s, CH$_2$), 5.21(2H, s, CH$_2$), 5.27(2H, s, CH$_2$), 6.60–7.09(3H, m, ArH) |

Synthesis Example 18

Synthesis of 1,2,3-tris(isopropoxymethoxy)benzene

Using pyrogallol in place of phloroglucinol used in Synthesis Example 13 and isopropoxymethylchloride obtained in Synthesis Example 2, the reaction and treatment were carried out in the same manner as described in Synthesis Example 13 to give the corresponding 1,2,3-tris(isopropoxymethoxy)benzene as a yellow oil.

$^1$HNMR δppm (CDCl$_3$): 1.18–1.21(18H,d,CH$_3$×6), 3.99–4.08(2H,m, CH×2), 4.19–4.23(1H,m,CH), 5.18(2H,s,CH$_2$), 5.31(4H,s,CH$_2$×2), 6.84–6.97(3H,m, ArH).

Synthesis Example 19

Synthesis of polyvinylphenol (1) Free radical polymerization of p-tert-butoxystyrene A solution of p-tert-butoxystyrene (17.6 g) in toluene containing catalytic amount of 2,2'-azobisisobutyronitrile (AIBN) was heated at 80° C. for 6 hours under nitrogen. After cooling, the reaction mixture was poured into methanol (1 l) to precipitate the polymer. The polymer was filtered, washed with methanol and dried under reduced pressure to afford 15.5 g of poly(p-tert-butoxystyrene) as a white powder having Mw ca. 10000 (GPC with polystyrene calibration).

(2) Synthesis of polyvinylphenol

A solution of poly(p-tert-butoxystyrene) (15.0 g) obtained in above (1) and conc. hydrochloric acid (10 ml) in 1,4-dioxane was refluxed for 4 hours with stirring. The mixture was cooled and poured into H$_2$O (1 l). A solid was precipitated. The polymer was filtered, washed with H$_2$O and dried under reduced pressure to give 9.7 g of polyvinylphenol as a white powder.

Synthesis Example 20

Synthesis of poly(p-tert-butoxystyrene/p-hydroxystyrene)

A solution of poly(p-tert-butoxystyrene)(15.0 g) obtained in above (1) and conc. hydrochloric acid (10 ml) in 1,4-dioxane was reacted for 3 hours with stirring at 80°–85° C. The mixture was cooled and poured into H$_2$O (1 l) to precipitate a solid. The polymer was filtered, washed with H$_2$O and dried under reduced pressure to afford 9.8 g of poly(p-tert-butoxystyrene/p-hydroxystyrene) as a white powder having Mw ca. 9500 (GPC with polystyrene calibration). The polymer was found to have p-tertbutoxystyrene unit and p-hydroxystyrene unit in a molar ratio of ca. 1:9 based on $^1$HNMR.

Synthesis Example 21

Synthesis of 2-cyclohexylcarbonyl-2-(p-toluenesulfonyl)propane (1) To a suspension of magnesium turning (23.9 g, 0.98 mole) in dry ethyl ether, cyclohexylbromide (160 g, 0.98 mole) was added dropwise under mild reflux, followed by reaction with stirring for 1 hour under reflux to afford a Grignard reagent.

After cooling, the Grignard reagent was added dropwise to a solution of isobutyroyl chloride (95 g, 0.89 mole) in dry ethyl ether at −5°–0° C. The resultant mixture was stirred at the same temperature for 3 hours and allowed to stand at room temperature overnight. The reaction mixture was poured into H$_2$O. The organic layer was separated, washed with H$_2$O, dried over anhydrous MgSO$_4$ and evaporated. The residue was distilled under reduced pressure to give 50 g of 1-cyclohexyl-2-methyl-1-propanone as a pale yellow oil having a boiling point of 95°–100° C./20 mmHg.

$^1$HNMR δppm (CDCl$_3$): 1.06(6H,d,CH$_3$×2), 1.12–1.87(10H,m, cyclohexylic-CH$_2$×5), 2.51(1H,m, cyclohexylic-CH), 2.76(1H,m,CH)

IR(Neat) νcm$^{-1}$:1710 (C=0).

(2) To 1-cyclohexyl-2-methyl-1-propanone (47.6 g, 0.31 mole) obtained in above (1), sulfuryl chloride (42 g, 0.31 mole) was added dropwise at 25°–35° C. The mixture was stirred at 50° C. for 3.5 hours and then evaporated. The resultant residue was distilled under reduced pressure to give 30.1 g of 2-chloro-1-cyclohexyl-2-methyl-1-propanone as a yellow oil having a boiling point of 99°–105° C./18 mmHg.

$^1$HNMR δppm (CDCl$_3$) : 1.18–1.87(16H,m,CH$_2$×2) and cyclohexylic-CH$_2$×5), 3.13(1H,m, cyclohexylic-CH).

(3) A solution of 2-chloro-1-cyclohexyl-2-methyl-1-propanone (30.3 g, 0.16 mole) obtained in above (2) and sodium p-toluenesulfinate (30.0 g, 0.17 mole) in dimethylsulfoxide (320 ml) was reacted with stirring at 60° C. for 20 hours. The reaction mixture was poured into cold H$_2$O, and stirred at 0°–5° C. for 1 hour. The precipitate was filtered, washed with H$_2$O and dried. The crude solid (18 g) was recrystallized from n-hexane/benzene to give 13.5 g of 2-cyclohexylcarhonyl-2-(p-toluenesulfonyl)propane as white needles, mp. 123°–123.5° C.

$^1$HNMR δppm (CDCl$_3$) : 1.19–1.91(16H,m,CH$_3$×2 and cyclohexylic-CH$_2$×5), 2.45(3H, s, Ar—CH$_3$), 3.25(1H,m, cyclohexylic-CH), 7.33(2H,d,J=8Hz,Aromatic 3-H,5-H), 7.65(2H,d,J=8Hz,Aromatic 2-H,6-H).

IR(KBr-disk)νcm$^{-1}$: 1705 (C=0), 1310

Synthesis Example 22

Synthesis of bis(cyclohexylsulfonyl)diazomethane (1) After dissolving sodium azide (22.5 g, 0.35 mole) in a small amount of H$_2$O, the resulting solution was diluted with a 90% ethanol aqueous solution (130 ml).

To this, a solution of p-toluenesulfonyl chloride (60 g, 0.32 mole) in ethanol (300 ml) was added dropwise at 10°–25° C., followed by reaction at room temperature for 2.5 hours. The reaction solution was concentrated at room temperature under reduced pressure. The resulting oily residue was washed several times with H$_2$O and dried over anhydrous MgSO$_4$. After removing the drying agent by filtration, there was obtained 50.7 g of p-toluenesulfonylazide as a colorless oil.

$^1$HNMR δppm (CDCl$_3$): 2.43(3H,s,CH$_3$), 7.24(2H,d,J=8Hz,Aromatic 3-H,5-H), 7.67(2H,d,J=8Hz,Aromatic 2-H,6-H).

IR(Neat) ν cm$^{-1}$: 2120 (—N$_3$).

(2) To cyclohexanethiol (20.2 g, 0.17 mole), a solution of potassium hydroxide (12.0 g, 0.21 mole) in ethanol (50 ml) was added dropwise at room temperature and stirred at 30±5° C. for 30 minutes. Then, methylene chloride (18.2 g, 2.14 mole) was added to this mixture and reacted with stirring at 50±5° C. for 6 hours. After standing at room temperature overnight, the reaction mixture was diluted with ethanol (55 ml) and added with sodium tungstate (0.4 g). Then, 30% hydrogen peroxide (50 g, 0.44 mole) was added dropwise to this solution at 45°–50° C., and reacted with stirring for 4 hours at the same temperature, added with H$_2$O (200 ml) and allowed to stand at room temperature overnight. The precipitate was filtered, washed with H$_2$O and dried. The resultant solid (22 g) was recrystallized from ethanol to give 15.5 g of bis(cyclohexylsulfonyl)diazomethane as white needles, mp. 137°–139° C.

$^1$HNMR δppm (CDCl$_3$) : 1.13–2.24(20H,m, cyclohexylic- CH$_2$×10), 3.52–3.66(2H,m,cyclohexylic-CH×2), 4.39(2H,s,CH$_2$).

IR(KBr-disk) ν cm$^{-1}$: 1320, 1305.

(3) To a solution of sodium hydroxide (1.7 g) in a 60% ethanol aqueous solution (70 ml), bis(cyclohexylsulfonyl)methane (12.1 g, 0.04 mole) obtained in above (2) was added. Then, a solution of p-toluenesulfonylazide (8.2 g, 0.04 mole) obtained in above (1) in ethanol (10 ml) was added dropwise at 5°–10° C., followed by the reaction at room temperature for 7 hours. After standing at room temperature overnight, the precipitate was filtered, washed with ethanol and dried. The resultant residue (11 g) was recrystallized from acetonitrile to give 8.0 g of bis(cyclohexylsulfonyl)diazomethane as pale yellow prisms having a melting point of 130°–131° C.

$^1$HNMR δppm (CDCl$_3$) : 1.13–2.25(20H,m, cyclohexylic-CH$_2$×10), 3.36–3.52(2H,m, cyclohexylic-CH×2).

IR(KBr-disk)νcm$^{-1}$: 2130(CN$_2$), 1340, 1320.

Synthesis Example 23

Synthesis of 2,6-dinitrobenzyl p-toluenesulfonate (1) To a suspension of 2,6-dinitrobenzaldehyde (19.6 g, 0.1 mole) in methanol (200 ml), sodium borohydride (5.8 g) was added in a small portion at 15°–25° C., the resultant mixture was stirred at room temperature for 1 hour and then concentrated. To the residue, H$_2$O (100 ml) and chloroform (100 ml) were added. After stirring for 1 hour, the chloroform layer was separated, washed with H$_2$O, dried over anhydrous MgSO$_4$ and evaporated to afford 15.0 g of 2,6-dinitrobenzyl alcohol as yellow crystals, mp. 92.5°–93.5° C.

$^1$HNMR δppm (CDCl$_3$): 2.77(1H,t,J=7Hz,OH), 4.97(2H,d,J=7Hz,CH$_2$), 7.66(1H,t,J=8Hz,Aromatic 4-H), 8.08(2H,t,J=8Hz,Aromatic 3-H,5-H).

(2) To a solution of 2,6-dinitrobenzyl alcohol (14.9 g, 0.075 mole) obtained in above (1) and p-toluenesulfonyl chloride (15.7 g, 0.083 mole) in acetone (150 ml), a solution of dicyclohexylamine (15 g) in acetone was added dropwise at 0°–10° C., and stirred for 4 hours at room temperature. A precipitate was filtered off and the filtrate was evaporated. The residue (29 g) was recrystallized from carbon tetrachloride to give 19.8 g of 2,6-dinitribenzyl p-toluenesulfonate as pale yellow leaflets. mp. 98°–99° C.

$^1$HNMR δppm (CDCl$_3$): 2.45(3H,s,CH$_3$), 5.57(2H,s,CH$_2$), 7.34(2H,d,J=8Hz, p-tolyl 3-H,5-H), 7.68(1H,t,J=8Hz,2.6-(O$_2$N)$_2$-Ar 4-H), 7.72(2H,d,J=8Hz, p-tolyl 2-H,6-H), 8.06(2H,d,J=8Hz, 2.6-(O$_2$N)$_2$-Ar 3-H,5-H).

IR(KBr-disk)νcm$^{-1}$: 1360, 1170.

Synthesis Example 24

Synthesis of 2-methyl-2-(p-toluenesulfonyl)propiophenone

Using isobutyrophenone (29.6 g, 0.2 mole), the reaction was carried out in the same manner as described in Synthesis Example 21, (2) and (3). The crude solid was recrystallized from methanol to afford 21.2 g of 2-methyl-2-(p-toluenesulfonyl)propiophenone as white needles having a melting point of 64°–64.5° C.

$^1$HNMR δppm (CDCl$_3$): 1.70(6H,s,CH$_3$×2), 2.45(3H,s, Ar-CH$_3$), 7.32(2H,d,J=7Hz, p-tolyl 3-H,5-H), 7.44(2H,t,J=7Hz, Aromatic 3-H,5-H), 7.54(1H,t,J=7Hz, Aromatic 4-H), 7.67(2H,d,J=7Hz,p-tolyl 2-H,6-H), 7.95(2H,d,J=8Hz,Aromatic 2-H,6-H).

IR(KBr-disk)ν cm$^{-1}$: 1680(C=O), 1303, 1290.

Synthesis Example 25

Synthesis of 1-(p-toluenesulfonyl)-1-(2,2-dimethyl)-propanoyldiazomethane (1) To a solution of 1-bromo-3,3-dimethyl-2-butanone (33,3 g, 0.19 mole) in dimethylsulfoxide (330 ml), sodium o-toluenesulfinate (34.9 g, 0.20 mole) was added at 30°–40° C., and reacted with stirring at 60°–70° C. for 18 hours. The reaction mixture was poured into cold H$_2$O (2 l). The precipitate was filtered, washed with H$_2$O and dried to afford 41.6 g of 1-(p-toluenesulfonyl)-2,2-dimethylpropanoylmethane as white crystals, mp. 119°–122° C.

$^1$HNMR δppm (CDCl$_3$): 1.12(9H,s,CH$_3$×3), 2.45(3H,s,CH$_3$), 4.31(2H,s,CH$_2$), 7.36(2H,d,J=8Hz,Aromatic 3-H,5-H), 7.82(2H,d,J=8Hz,Aromatic 2-H,6-H).

IR(KBr-disk)νcm$^{-1}$: 1715(C=O), 1320, 1290.

(2) To a solution of 1-(p-toluenesulfonyl)-2,2-dimethylpropanoylmethane (20 g, 0.08 mole) obtained in above (1) in methylene chloride (160 ml), triethylamine (9.2 g, 0.09 mole) was added dropwise at 5°–10° C., and continued to stir for 15 minutes. Then p-toluenesulfonyl azide (18.3 g, 0.09 mole) obtained in Synthesis Example 22(1) was added dropwise at 5°–10° C. to the mixture, and reacted with stirring at room temperature for 7 hours. After standing at room temperature overnight, the reaction mixture was concentrated under reduced pressure. The resultant residue was dissolved in ethyl ether (200 ml) and ethyl acetate (50 ml), washed with 5% potassium hydroxide (200 ml×1) and brain (100 ml×1), and dried over anhydrous MgSO$_4$. The drying agent was filtered off, the filtrate was evaporated and the residual crude solid (24 g) was recrystallized from ethanol to give 12.6 g of 1-(p-toluenesulfonyl)-1-(2,2-dimethyl)propanoyldiazomethane as pale yellow leaflets having a melting point of 120.5°–121.5° C.

$^1$HNMR δppm (CDCl$_3$) : 1.17(9H,s,CH$_3$×3), 2.44(3H,s, Ar-CH$_3$), 7.34(2H,d,J=8Hz,Aromatic 3-H,5-H), 7.93(2H,d,J=8Hz,Aromatic 2-H,6-H).

IR(KBr-disk)ν cm$^{-1}$: 2140(CN$_2$), 1660(C=O), 1600, 1355, 1305.

Example 1

A photoresist composition was prepared according to the following recipe. A pattern was formed in the manner described below:

| | |
|---|---|
| Polyvinylphenol (the polymer of Synthesis Example 19) | 4.4 g |
| 1,3,5-Tris(methoxymethoxy)benzene (the compound of Synthesis Example 4) | 0.7 g |
| 2-Cyclohexylcarbonyl-2-(p-toluenesulfonyl)propane (the photoacid generator of Synthesis Example 21) | 0.2 g |
| Diethyleneglycol dimethyl ether | 14.7 g |

A pattern formation process using the above photoresist composition is explained below with reference to FIG. 1. The above photoresist composition 2 was spin-coated on a semiconductor substrate 1 and pre-baked on a hot plate at 90° C. for 90 seconds to obtain a photoresist composition film of 1.0 μm in thickness (FIG. 1A). In many cases, an insulated film or a conductive film and so on was formed on the above substrate. Then, the film was selectively exposed to KrF excimer laser beams 3 having a wavelength of 248.4 nm through a mask 4 (FIG. 1B). After post-baking on a hot plate at 130° C. for 90 seconds, the film was developed with an alkali developing solution (a 2.38% aqueous tetramethylammonium hydroxide solution) for 60 seconds to dissolve away only the unexposed portion of the photoresist composition 2, whereby a negative pattern 2a was obtained (FIG. 1C). The negative pattern obtained showed a resolution of 0.35 μm line-and-space. In this case, the exposure dose was about 10 mJ/cm$^2$. When a pattern change with a delay time between exposure and post-exposure-bake (PEB) was measured using said photoresist composition, 0.35 μm line-and-space could be resolved without any trouble even after the lapse of 4 hours.

Example 2

A photoresist composition was prepared according to the following recipe.

| | |
|---|---|
| Poly(p-tert-butoxystyrene/p-hydroxystyrene) (the polymer of Synthesis Example 20) | 4.5 g |
| 1,3,5-Tris(methoxymethoxy)benzene | 0.7 g |
| 2-Methyl-2-(p-toluenesulfonyl)propiophenone (the photoacid generator of Synthesis Example 24) | 0.2 g |
| Diethyleneglycol dimethylether | 14.6 g |

Using the above photoresist composition, pattern formation was carried out in the same manner as described in Example 1. As a result, the same negative pattern as obtained in Example 1 showed a resolution of 0.40 μm line-and-space. In this case, the exposure dose was about 15 mJ/cm$^2$. Further, even the time from exposure to PEB elapsed 4 hours, the pattern dimension was not changed.

Examples 3–22

Photoresist composition were prepared according to the respective recipes shown in Table 5.

TABLE 5

| Example No. | Photoresist Composition | |
|---|---|---|
| 3 | Poly(p-tert-butoxystyrene/p-hydroxystyrene) | 4.5 g |
| | 1,3,5-Tris(methoxymethoxy)benzene | 0.7 g |
| | 2,6-Dinitrobenzyl p-toluenesulfonate (the compound generator of Synthesis Example 23) | 0.3 g |
| | Propyleneglycol monoethylether acetate | 13.7 g |
| 4 | Polyvinylphenol | 4.5 g |
| | 1,3,5-Tris(methoxymethoxy)benzene | 0.5 g |
| | Bis(cyclohexylsulfonyl)diazomethane (the photoacid generator of Synthesis Example 22) | 0.3 g |
| | Diethyleneglycol dimethylether | 14.7 g |
| 5 | Poly(p-tert-butoxystyrene/p-hydroxystyrene) | 4.5 g |
| | 1,3,5-Tris(methoxymethoxy)benzene | 0.5 g |
| | 1-(p-Toluenesulfonyl)-1-(2,2-dimethyl)-propanoyldiazomethane (the photoacid generator of synthesis Example 25) | 0.3 g |
| | Diethyleneglycol dimethylether | 14.7 g |
| 6 | Polyvinylphenol | 4.5 g |
| | 1,2,4-Tris(isopropoxymethoxy)benzene (the compound of Synthesis Example 17) | 0.8 g |
| | 2-Cyclohexylcarbonyl-2-(p-toluenesulfonyl)-propane | 0.3 g |
| | Propyleneglycol monomethylether acetate | 14.4 g |
| 7 | Polyvinylphenol | 4.5 g |
| | 1,3,5-Tris(isopropoxymethoxy)benzene (the compound of Synthesis Example 13) | 0.8 g |
| | Bis(cyclohexylsulfonyl)diazomethane | 0.3 g |
| | Propyleneglycol monomethylether acetate | 14.4 g |
| 8 | Poly(p-tert-butoxystyrene/p-hydroxystyrene) | 4.5 g |
| | 1,3-Bis(cyclohexyloxymethoxy)benzene (the compound of Synthesis Example 8) | 1.2 g |
| | 2-Methyl-2-(p-toluenesulfonyl)-propiophenone | 0.3 g |
| | Ethyl lactate | 14.0 g |
| 9 | Polyvinylphenol | 4.5 g |
| | 1,4-Bis(sec-butoxymethoxy)benzene (the compound of Synthesis Example 11) | 1.5 g |
| | 2-Cyclohexylcarbonyl-2-(p-toluenesulfonyl)-propane | 0.3 g |
| | Methyl 3-methoxypropionate | 13.7 g |
| 10 | Polyvinylphenol | 4.5 g |
| | 1,2,4-Tris(methoxymethoxy)benzene (the compound of Synthesis Example 16) | 0.8 g |
| | 2,6-Dinitrobenzyl p-toluenesulfonate | 0.3 g |
| | Ethyl pyruvate | 14.4 g |
| 11 | Polyvinylphenol | 4.5 g |
| | 1,3-Bis(methoxymethoxy)benzene (the compound of Synthesis Example 5) | 1.5 g |
| | 1-(p-Toluenesulfonyl)-1-(2,2-dimethyl)-propanoyldiazomethane | 0.3 g |
| | Ethyl cellosolve acetate | 13.7 g |
| 12 | Poly(p-tert-butoxystyrene/p-hydroxystyrene) | 4.5 g |
| | 1,3-Bis(sec-butoxymethoxy)benzene (the compound of Synthesis Example 7) | 1.5 g |
| | 2-Methyl-2-(p-toluenesulfonyl)-propiophenone | 0.3 g |
| | Diethyleneglycol dimethylether | 13.7 g |
| 13 | Polyvinylphenol | 4.5 g |
| | 1,4-Bis(isopropoxymethoxy)benzene (the compound of Synthesis Example 10) | 1.5 g |
| | 2-Cyclohexylcarbonyl-2-(p-toluenesulfonyl)-propane | 0.3 g |
| | Ethyl lactate | 13.7 g |
| 14 | Polyvinylphenol | 4.5 g |
| | 1,3,5-Tris(cyclohexyloxymethoxy)benzene (the compound of Synthesis Example 15) | 0.8 g |
| | 2,6-Dinitrobenzyl p-toluenesulfonate | 0.3 g |
| | Methyl cellosolve acetate | 14.4 g |
| 15 | Polyvinylphenol | 4.5 g |
| | 1,3,5-Tris(sec-butoxymethoxy)benzene (the compound of Synthesis Example 14) | 0.8 g |
| | Bis(cyclohexylsulfonyl)diazomethane | 0.3 g |
| | Propyleneglycol monomethylether acetate | 14.4 g |
| 16 | Poly(p-tert-butoxystyrene/p-hydroxystyrene) | 4.5 g |
| | 1,4-Bis(cyclohexyloxymethoxy)benzene (the compound of Synthesis Example 12) | 1.2 g |
| | 1-(p-Toluenesulfonyl)-1-(2,2-dimethyl)-propanoyldiazomethane | 0.3 g |
| | Ethyl cellosolve acetate | 14.0 g |
| 17 | Polyvinylphenol | 4.5 g |
| | 1,3-Bis(isopropoxymethoxy)benzene (the compound of Synthesis Example 6) | 1.5 g |
| | 2,6-Dinitrobenzyl p-toluenesulfonate | 0.3 g |
| | Methyl cellosolve acetate | 13.7 g |
| 18 | Polyvinylphenol | 4.5 g |
| | 1,2,3-Tris(isopropoxymethoxy)benzene (the compound of Synthesis Example 18) | 0.8 g |
| | Bis(cyclohexylsulfonyl)diazomethane | 0.3 g |
| | Propyleneglycol monomethylether acetate | 14.4 g |
| 19 | Poly(p-tert-butoxystyrene/p-hydroxystyrene) | 4.5 g |
| | 1,4-Bis(methoxymethoxy)benzene (the compound of Synthesis Example 9) | 1.2 g |
| | 2-Cyclohexylcarbonyl-2-(p-toluenesulfonyl)-propane | 0.3 g |
| | Ethyl lactate | 14.0 g |
| 20 | Poly(p-tert-butoxystyrene/p-hydroxystyrene) | 4.5 g |
| | 1,3,5-Tris(sec-butoxymethoxy)benzene | 0.8 g |
| | Bis(cyclohexylsulfonyl)diazomethane | 0.3 g |
| | Propyleneglycol monomethylether acetate | 14.4 g |
| 21 | Polyvinylphenol | 4.5 g |
| | 1,2,4-Tris(isopropoxymethoxy)benzene | 0.8 g |
| | 2-Cyclohexylcarbonyl-2-(p-toluenesulfonyl)-propane | 0.3 g |
| | Ethyl lactate | 14.4 g |
| 22 | Polyvinylphenol | 4.5 g |
| | 1,3,5-Tris(isopropoxymethoxy)benzene | 0.8 g |
| | 1-(p-Toluenesulfonyl)-1-(2,2-dimethyl)-propanoyldiazomethane | 0.3 g |
| | Ethyl lactate | 14.4 g |

Pattern formation was carried out in the same manner as described in Example 1 except for using each photoresist composition prepared in the above. The results obtained are shown in Table 6.

TABLE 6

| Example No. | Exposure dose (mJ/cm$^2$) | Resolution (μm line-and-space) |
|---|---|---|
| 3 | 12 | 0.40 |
| 4 | 15 | 0.35 |
| 5 | 18 | 0.35 |
| 6 | 15 | 0.30 |
| 7 | 18 | 0.30 |
| 8 | 12 | 0.40 |
| 9 | 12 | 0.40 |
| 10 | 15 | 0.40 |
| 11 | 15 | 0.40 |
| 12 | 18 | 0.40 |
| 13 | 15 | 0.40 |
| 14 | 18 | 0.35 |
| 15 | 15 | 0.30 |
| 16 | 15 | 0.40 |
| 17 | 15 | 0.40 |
| 18 | 18 | 0.30 |
| 19 | 15 | 0.40 |
| 20 | 18 | 0.30 |
| 21 | 18 | 0.30 |
| 22 | 15 | 0.35 |

In any of Examples 3 to 22, a negative pattern could be resolved without any trouble even after the lapse of 4 hours between exposure and PEB, as described in Examples 1 and 2.

What is claimed is:

1. A negative working resist composition comprising an admixture of:
   (a) an alkali-soluble resin in a film-forming amount,
   (b) a compound of the formula:

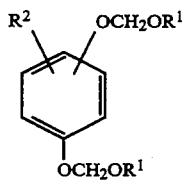

[I]

wherein $R^1$ is an alkyl group having 1 to 10 carbon atoms or an aralkyl group; and $R^2$ is a hydrogen atom, a hydroxyl group, an alkoxy group having 1 to 5 carbon atoms, an alkyl group having 1 to 10 carbon atoms or a group of the formula: —OCH$_2$OR$^1$, in amount sufficient to cross-link with at least a portion of the resin,
   (c) a photosensitive compound in an amount sufficient to generate an acid upon exposure to light, and
   (d) a solvent in an amount sufficient to dissolve the components (a) to (c).

2. A resist composition according to claim 1, wherein the component (c) is a compound of the formula:

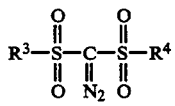

[II]

wherein $R^3$ and $R^4$ are independently a straight-chain, branched or cyclic alkyl group having 1 to 10 carbon atoms, a haloalkyl group having 1 to 10 carbon atoms or a group of the formula:

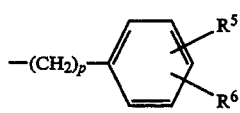

[III]

wherein $R^5$ and $R^6$ are independently a hydrogen atom, a straight-chain or branched alkyl group having 1 to 5 carbon atom or a straight-chain or branched haloalkyl group having 1 to 5 carbon atoms; and p is zero or an integer of 1 or more.

3. A resist composition according to claim 1, wherein the component (c) is a compound of the formula:

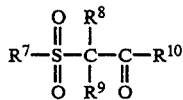

[IV]

wherein $R^7$ is a straight-chain, branched or cyclic alkyl group having 1 to 10 carbon atoms, a trifluoromethyl group, a phenyl group or a tolyl group; $R^8$ and $R^9$ are independently a hydrogen atom or a straight-chain, or branched alkyl group having 1 to 5 carbon atoms; and $R^{10}$ is a straight-chain, branched or cyclic alkyl group having 1 to 10 carbon atoms, a phenyl group, a halogen-substituted phenyl group, an alkyl-substituted phenyl group, an alkoxy-substituted phenyl group or an alkylthio-substituted phenyl group.

4. A resist composition according to claim 1, wherein the component (c) is a compound of the formula:

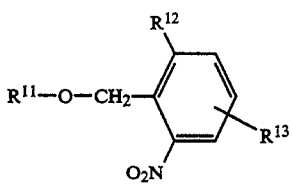

[V]

wherein $R^{11}$ is a trichloroacetyl group, a p-toluenesulfonyl group, a p-trifluoromethylbenzenesulfonyl group, a methanesulfonyl group or a trifluoromethanesulfonyl group; $R^{12}$ and $R^{13}$ are independently a hydrogen atom, a halogen atom or a nitro group.

5. A resist composition according to claim 1, wherein the component (c) is a compound of the formula:

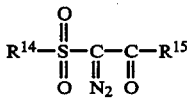

[VI]

wherein $R^{14}$ is a straight-chain, branched or cyclic alkyl group having 1 to 10 carbon atoms, an aralkyl group or an aryl group; and $R^{15}$ is a straight-chain, branched or cyclic alkyl group having 1 to 10 carbon atoms or an aralkyl group.

6. A resist composition according to claim 1, wherein the component (c) is a compound of the formula:

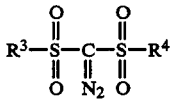

[II]

wherein $R^3$ and $R^4$ are independently a straight-chain alkyl group having 1 to 10 carbon atoms.

7. A resist composition according to claim 1, wherein the component (c) is bis(cyclohexylsulfonyl)-diazomethane.

8. A resist composition according to claim 1, wherein the component (b) is contained in an amount of 0.01 to 0.5 part by weight, the component (c) is contained in an amount of 0.01 to 0.3 part by weight and the component (d) is contained in amount of 1 to 20 parts by weight, per part by weight of component (a).

* * * * *